United States Patent [19]

Nagayoshi

[11] Patent Number: 5,477,081

[45] Date of Patent: Dec. 19, 1995

[54] SEMICONDUCTOR DEVICE PACKAGE

[75] Inventor: Shinsuke Nagayoshi, Itami, Japan

[73] Assignee: Mitsubishi Denki Kabushiki Kaisha, Tokyo, Japan

[21] Appl. No.: 857,249

[22] Filed: Mar. 25, 1992

[30] Foreign Application Priority Data

Mar. 29, 1991 [JP] Japan .................................. 3-093482

[51] Int. Cl.$^6$ ........................ H01L 23/02; H01L 23/053; H01L 23/12

[52] U.S. Cl. ........................ 257/678; 257/684; 257/701; 257/704; 257/712

[58] Field of Search .................................. 257/722, 678, 257/684, 701, 702, 703, 704, 710, 712

[56] References Cited

U.S. PATENT DOCUMENTS

| | | | |
|---|---|---|---|
| 3,740,920 | 6/1973 | Lane | 53/39 |
| 4,788,626 | 11/1988 | Neidig et al. | 361/386 |
| 4,926,242 | 5/1990 | Itoh et al. | 257/722 |

FOREIGN PATENT DOCUMENTS

| | | |
|---|---|---|
| 0237739 | 1/1987 | European Pat. Off. . |
| 60-160146 | 8/1985 | Japan . |
| 60-213047 | 10/1986 | Japan . |
| 61-256746 | 11/1986 | Japan . |
| 62-219949 | 9/1987 | Japan . |

OTHER PUBLICATIONS

A. H. Kumar and J. Ordonez, IBM Technical Disclosure Bulletin, vol. 24, No. 12, "Compact Thermal Conduction Module", May 1982, pp. 6432–6433.

Roupen L. Keusseyan, IEEE Transaction on Components and Manufacturing Technology, vol. 13, No. 1, "Brazing to Low–Temperature–Fired Thick Films", Mar. 1990, pp. 219–221.

Denda et al, "4×4096–Element SW IR Multispectral Focal Plane Array", SPIE, vol. 819, Infrared Technology XIII, 1987, pp. 279–286.

*Primary Examiner*—Sara W. Crane
*Assistant Examiner*—Carl Whitehead, Jr.
*Attorney, Agent, or Firm*—Leydig, Voit & Mayer

[57] ABSTRACT

A semiconductor device package includes a semiconductor package element for containing a semiconductor chip, a lid bonded to the semiconductor package using an adhesive agent, and a cooler bonded to a surface of the lid. The bonded surface between the semiconductor package and the lid is positioned inside the periphery of the lid by a predetermined distance. Thus, the adhesive agent does not adhere to a side nor surface of the lid and a cooler can be easily bonded to the lid surface. As a result, a highly reliable semiconductor device is provided and easily aligned at the time of forming a module by using a plurality of packages.

6 Claims, 6 Drawing Sheets

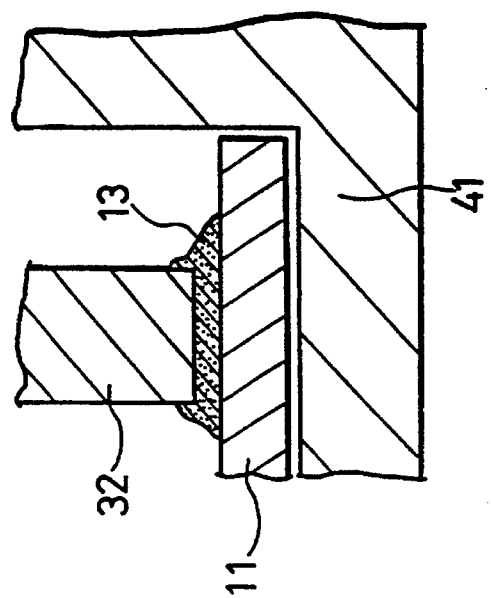
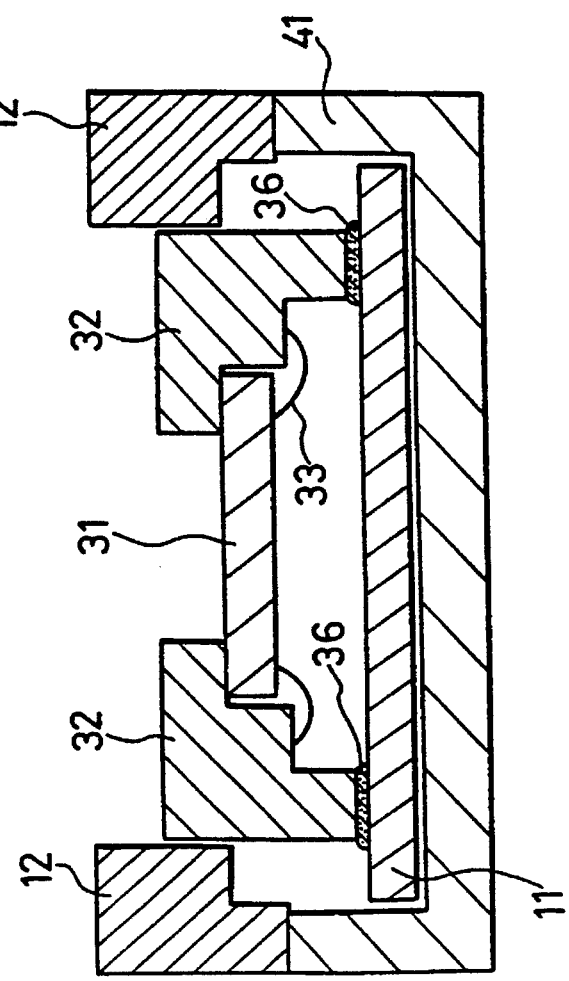

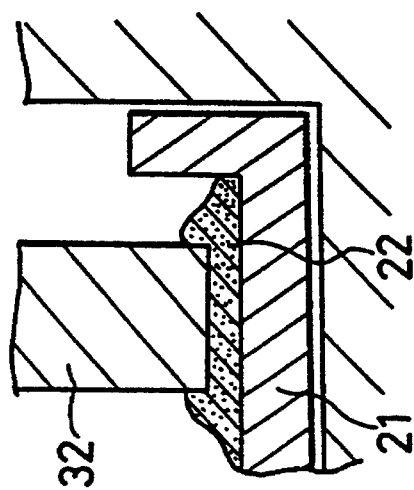
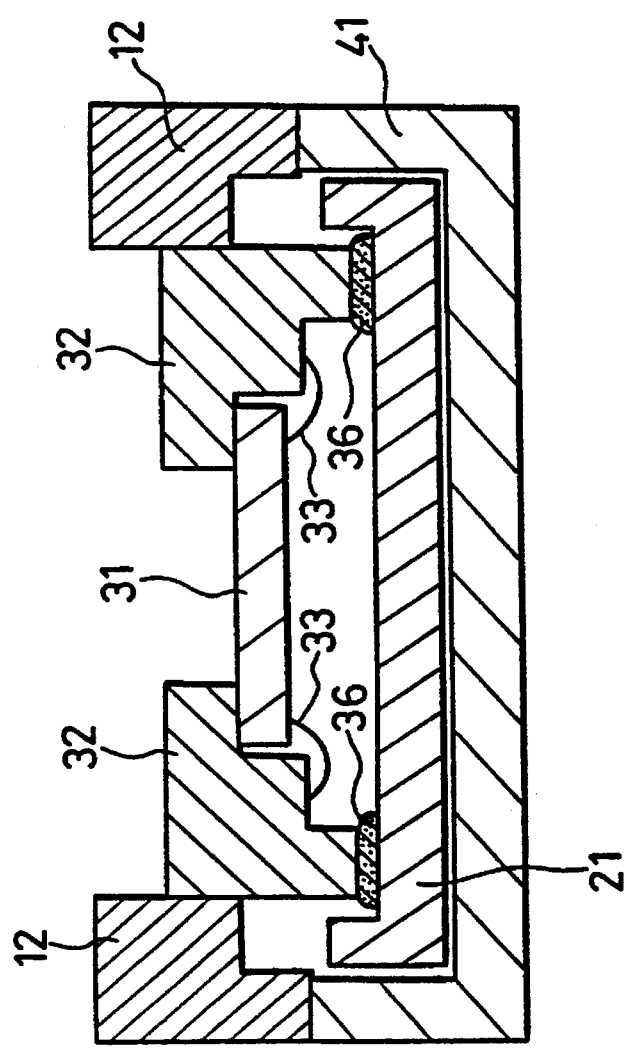
FIG. 2(a)
FIG. 2(b)

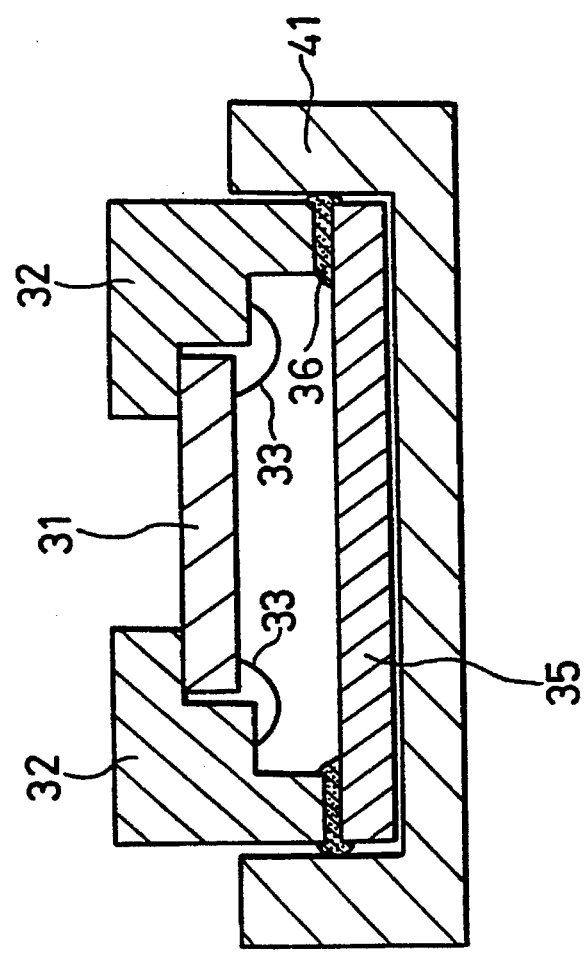
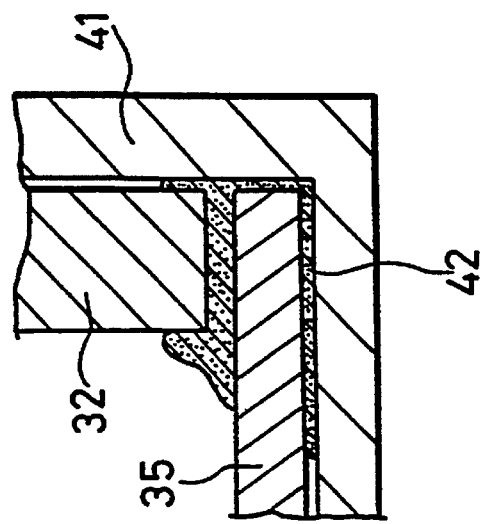
FIG. 4(a) (PRIOR ART)
FIG. 4(b) (PRIOR ART)

5,477,081

SEMICONDUCTOR DEVICE PACKAGE

FIELD OF THE INVENTION

The present invention relates to a semiconductor device package and, more particularly, to a bonding structure of a lid thereof.

BACKGROUND OF THE INVENTION

An infrared detector of a quantum type is generally used at an extremely low temperature such as a liquid nitrogen temperature (77K). Therefore, the infrared detector packaged in a semiconductor package has to be cooled down by some method.

FIG. 3(a) is a sectional view showing a structure of a prior art infrared detector using a cooler head as a cooling means. In FIG. 3(a), an infrared detector 31 is packaged in a semiconductor package 32 which is 15 by 16 mm in dimensions and is formed of aluminum oxide ($Al_2O_3$) or the like. The infrared detector 31 is electrically connected to the package 32 by wires 33. A lid 35 formed of a material such as ceramic which is 15 by 16 mm in dimensions, which is the same size as the package, and has a thickness of approximately 0.5 mm is bonded to the semiconductor package 32 via an adhesive agent 36. A cylindrical cooler head 34 having a diameter of 11 to 12 mm and formed of a material such as kovar which has the same thermal expansion coefficient as that of the lid 35 and also has high thermal conductivity is bonded to the surface of the lid using an adhesive agent 37. In addition, there is a space between the infrared detector 31 put in the semiconductor package 32 and the lid 35 and an air hole 35a is formed in the lid 35 (the air hole is omitted in the following drawings).

An almost cylindrical cooler head 34' whose upper part has the same square configuration as that of the lid 35 may be bonded as shown in FIG. 3(b).

In addition, in the infrared detector 31 a silicide film 312 of a metal such as Pt (PtSi) is disposed on a main surface of a silicon substrate 311 which is 12 by 16 mm in dimensions. On the surface of the film is disposed a silicon oxide layer 314 having a reflection film 313 of aluminum, and on the silicon oxide film layer 314 is disposed a protecting film 315 formed of a silicon nitride film. In addition, a pad 316, which is electrically in contact with the silicide film 312 for conducting a photoelectric current from the chip, is connected to the wire 33 outside the protecting film 315. Infrared light 317 incident on the back surface of the substrate 311 of the infrared detector 31 is photoelectrically converted on a Schottky surface of the silicide film 312 or is a once-reflected ray 318 incident on the reflection surface 313 and then photoelectrically converted on the Schottky surface of the silicide film 312. Then, the photoelectric current is transmitted to the wire 33 via the pad 316 and taken out of the chip.

In addition, it is necessary to cool down the infrared detector 31 in order to improve the photoelectric conversion characteristic on the Schottky surface during the above operation. This cooling is performed by cooling the package 32 through the lid 35 with the cooler head 34 as shown in FIGS. 3(a) and 3(b). As a method for cooling the cooler head 34 in this case, the cooler head 34 is brought into contact with liquid nitrogen or it is cooled using, for example a well-known SC cooler.

Next, a method for manufacturing the above semiconductor device package will be described. FIG. 4(a) is a view showing the semiconductor package 32 bonded to the lid 35 and FIG. 4(b) is an enlarged view showing a bonded part in FIG. 4(a) after fixing by heating (referred to as curing hereinafter). In FIG. 4(a), reference numeral 41 designates a guide fixture for aligning the semiconductor package 32 and the lid 35 at the time of bonding and reference numeral 42 designates an adhesive agent which is thinly spread between the semiconductor 32, the lid 35 and the guide fixture 41 through the curing after bonding.

At the time of bonding, the adhesive agent 36 is applied to the predetermined positions of the semiconductor package 32 and the lid 35. Then, the lid 35 is put on a concave part of the guide fixture 41, with the surface to which the adhesive agent 36 is applied upward. Then, as shown in FIG. 4(a), the semiconductor package 32 is put on the lid 35. The semiconductor package 32 is fixed to the lid 35 by curing the bonded parts, while a weight or the like is put on the semiconductor package 32. When the curing is completed, the bonding of the lid 35 is completed. Thereafter, the cooler head 34 is bonded to the lid 35 by applying the adhesive agent 37 on the surface of the lid 35 and patterning it into a desired configuration by using a template or the like.

Meanwhile, a part of the adhesive agent which was pressed out of the package 32 at the time of bonding is softened because its viscosity is once lowered by heat during the curing, whereby it is thinly spread into a space formed with the guide fixture 41 as shown in FIG. 4(b) and it is hardened on the surface of the lid 35. However, the guide fixture 41 is not bonded to the lid 35 by the projected adhesive agent 42 because Teflon or the like is applied to the contact surface between the guide fixture 41 and the lid 35.

If the adhesive agent 42 is on the lid 35 as described above, there can not be provided a desired pattern of the adhesive agent which is formed to bond the cooler head 34 by using the template. Even if the cooler head 34 is bonded by solder or the like instead of the adhesive agent, the solder can not be applied with high precision because of the projected adhesive agent 42. Particularly, its influence on a structure in which the cooler head is in contact with the whole surface of the lid as shown in FIG. 3(b). In either case, it is necessary to remove the projected adhesive agent using a scraper or the like. However, the surface of the lid 35 could be damaged when the adhesive agent is removed. When thermal stress is applied to this damaged part, a crack is generated in the lid 35, causing reliability of the apparatus to be decreased. In addition, the adhesive agent which could not be removed causes dust, whereby the reliability is also decreased.

In addition, in a case where the projected adhesive agent 42 does not reach the lid 35 and it is attached to a side of the lid 35, when modularization is implemented using a plurality of chips as shown in FIG. 5, a space d is present between the adjacent chips because of the adhesive agent on the side of the lid 35 and then alignment at the time of positioning can not be correctly performed.

As described above, according to the above-described prior art semiconductor device in which a lid is attached to a semiconductor package using an adhesive agent, the adhesive agent 42 is attached to the surface of the lid 35 or the like, which is an obstacle when the cooler head 34 is bonded on the surface of the lid 35, causing degradation of the reliability of the element.

SUMMARY OF THE INVENTION

The present invention was made to solve the above problems and it is an object of the present invention to provide a semiconductor device with high reliability in which an adhesive agent is not attached to a surface of a lid so that a cooler can be attached on the lid surface easily.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a lid bonded to a semiconductor package is larger than the semiconductor package so that a bonded surface between the package and the lid may be positioned inside the periphery of the lid. As a result, even if a part of the adhesive agent is pressed out of the bonded part between the lid and the package, it does not adhere to the side nor surface of the lid.

In addition, according to a second aspect of the present invention, the size of a lid bonded to a semiconductor package is larger than the semiconductor package so that a bonded surface between the package and the lid may be positioned inside the periphery of the lid and a convex part in a direction toward the bonded surface is provided on a periphery of the lid. As a result, the projected adhesive agent can be reliably prevented from adhering to the side or surface of the lid.

BRIEF DESCRIPTION OF THE DRAWINGS

FIGS. 1(a) and 1(b) are views each showing a semiconductor device in a bonded state in accordance with an embodiment of the present invention;

FIGS. 2(a) and 2(b) are views each showing a semiconductor device in a bonded state in accordance with another embodiment of the present invention;

FIGS. 4(a) and 4(b) are views each showing a semiconductor device in a bonded state in accordance with the prior art;

DETAILED DESCRIPTION OF PREFERRED EMBODIMENTS

Figure 3A:
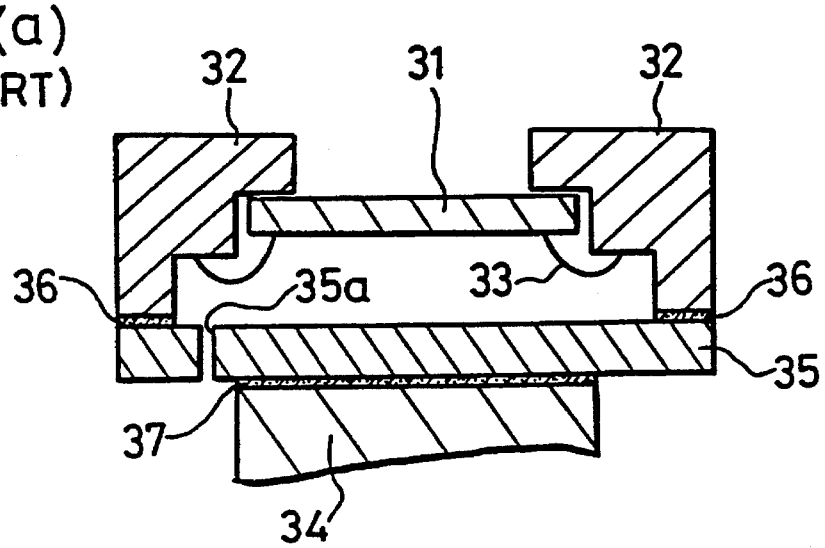
FIGS. 3(a) and 3(b) are views each showing a structure of a semiconductor device in which an infrared detector is attached to a cooler head in accordance with the prior art.
Figure 3B:
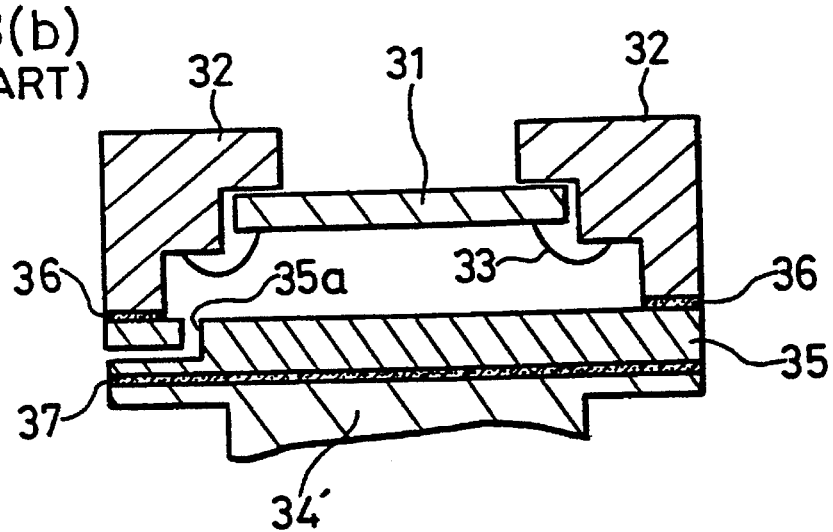
Figure 5:
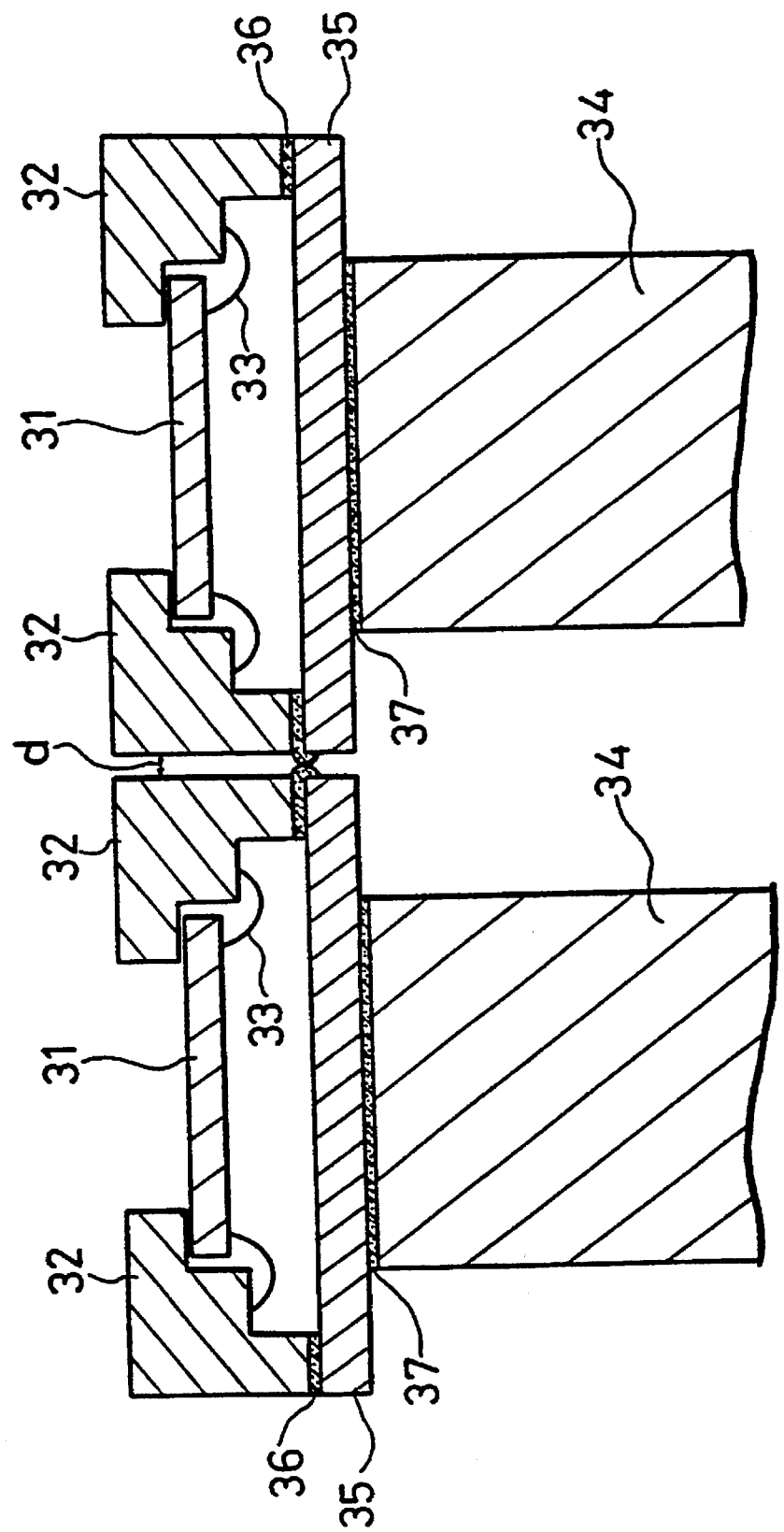
FIG. 5 is a view showing a plurality of prior art semiconductor devices mounted in a module.

An embodiment of the present invention will be described hereinafter. FIG. 1(a) is a view showing a bonded state of a semiconductor package and a lid and FIG. 1(b) is an enlarged view of a bonded part after cure. In FIG. 1(a), the same references as in FIG. 4 designate the same or corresponding parts. In addition, reference numeral 11 designates a lid, for example 16 to 17 mm in dimensions, which is larger than the semiconductor package 32 by 0.5 to 1 mm. Reference numeral 12 designates a guide for aligning the semiconductor package 32 and the lid 11. Reference numeral 13 designates an adhesive agent which was forced out at the time of bonding and curing.

As operation of the device is the same as that of the prior art, its description will be omitted here. A bonding method will be described hereinafter. First, the adhesive agent 36 is applied to predetermined positions of the semiconductor package 32 and the lid 11. Then, the lid 11 is put on the guide fixture 41 with a surface to which the adhesive agent 36 is applied upward. Then, the semiconductor package 32 is put on the lid 11 along the guide 12. In this state the adhesive is cured while a weight or the like is put on the semiconductor package 32.

As shown in FIG. 1(b), the adhesive agent 13 which projected a little before curing is once softened during curing. Then, its fluidity is increased and it is spread to the outside. However, even if the adhesive agent 13 is spread to the outside, it will not reach the side nor surface of the lid 11 because the lid 11 is larger than the package 32.

Next, another embodiment of the present invention will be described. As shown in FIG. 2(a), the lid 21 is larger than the package 32 and an L-shaped return part 21a which turns up by, for example, 0.2 to 0.3 mm in a direction where the adhesive agent is applied is formed at the periphery of the lid. Thus, even if the amount of the projected agent 22 is large, the adhesive agent 22 is stopped at the periphery of the lid 21 and then it can be surely prevented from reaching the side or surface of the lid 21. In addition, the configuration of the return part 21 is not limited to the L shape, but can be another configuration if a convex shape is formed in the direction toward the bonded surface between the package 32 and the lid 21.

In addition, the size of the lids 11 and 21 in the above embodiments of the present invention is not limited to the above-described dimensions and it may be changed in accordance with the size of the chip or fluidity of the adhesive agent.

Further, although the infrared detector is used as a device to which the present invention is applied in the above embodiments, it may be a device such as a high-output transistor in which a lid is bonded to a semiconductor package and a cooler is put on the lid.

Further, although a guide fixture having a concave part is used for bonding in the above embodiments of the present invention, a pin for alignment may be set up and used for bonding.

Figure 6:
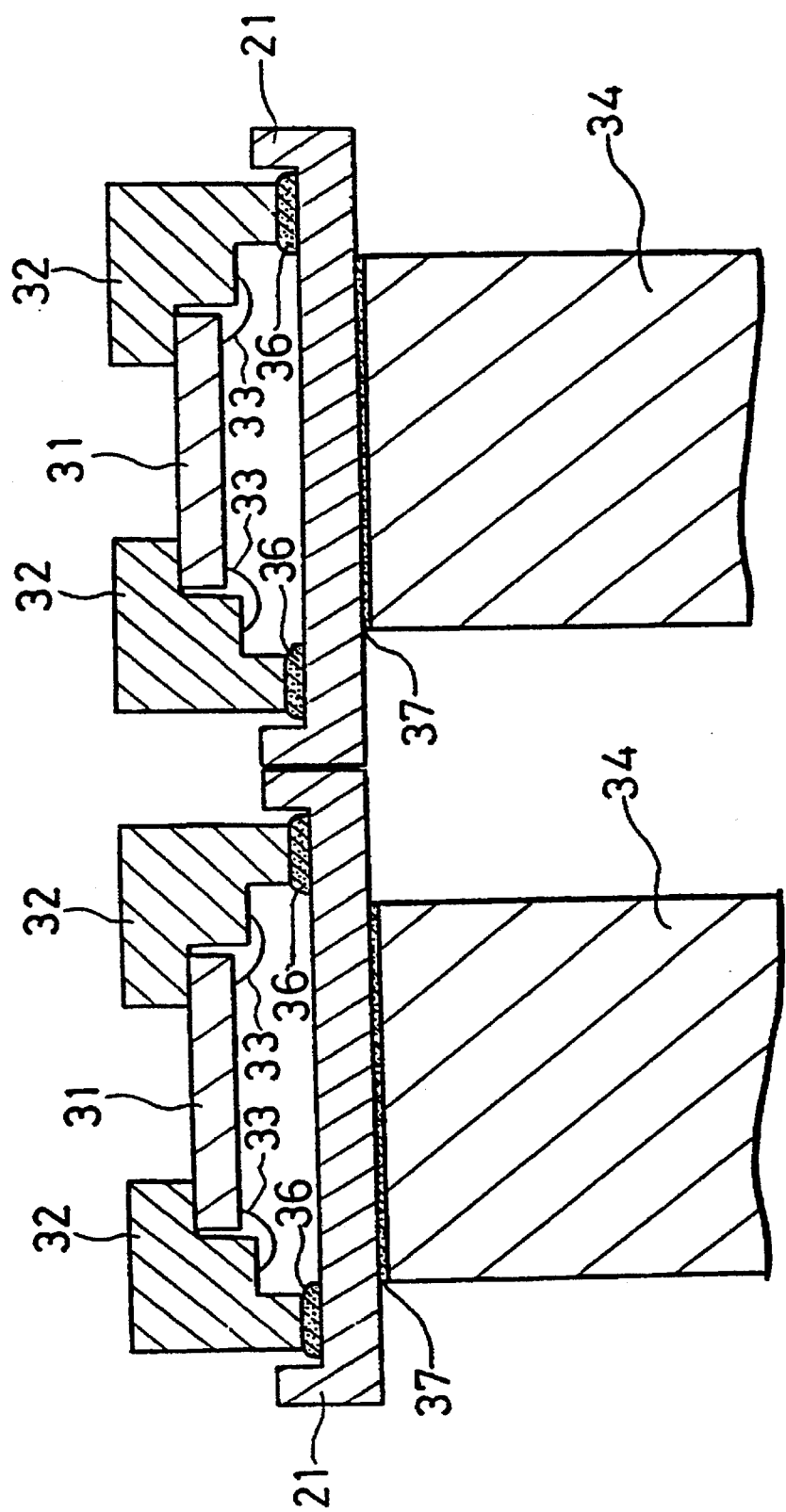
FIG. 6 is a view showing a plurality of semiconductor devices shown in FIG. 2(a) mounted in a module.

Further, when a plurality of chips shown in FIG. 2(a) are modularized as shown in FIG. 6, since no adhesive agent is present on the side of the lid 21, alignment can be correctly performed easily.

As described above, according to the semiconductor device of the present invention, since the size of the lid bonded to the semiconductor package is larger than the semiconductor package, the bonded surface between the package and the lid is positioned inside the lid. Thus, the adhesive agent does not adhere to a side nor surface of the lid and a cooler can be easily bonded to the lid surface. As a result, a semiconductor device with high reliability can be provided. In addition, when a plurality of chips are modularized, alignment can be correctly performed with ease.

In addition, since the size of the lid is larger than the semiconductor package and the convex part is formed at the periphery of the lid in the direction toward the bonded surface between the lid and the package, the adhesive agent is reliably prevented from adhering to the side and the surface of the lid.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device package comprising:

a unitary semiconductor package element including a base and side walls projecting transversely to said base for containing a semiconductor chip within said side walls;

a generally planar lid having opposed first and second surfaces and a periphery, a part of said first surface being bonded to said side walls of said semiconductor package element; and a cooler bonded to said second surface of said lid wherein the part of said first surface of said lid bonded to said side walls of said semiconductor package element is positioned inside and spaced from the periphery of said lid by a predetermined distance.

2. The semiconductor device package in accordance with claim 1 wherein said lid includes a projection at the periphery projecting away from, transversely to, and from said first surface and said side walls of said semiconductor package element are positioned inside and spaced from said projection by a predetermined distance.

3. The semiconductor device package in accordance with claim 1 wherein said lid is ceramic.

4. The semiconductor device package in accordance with claim 1 including a semiconductor chip comprising an infrared detector disposed within said semiconductor package element.

5. A semiconductor device wherein a plurality of semiconductor device packages according to claim 2 are modularized by bringing said semiconductor packages close to each other.

6. The semiconductor device package in accordance with claim 1 wherein said base of said semiconductor package element includes a central opening for admitting light to a semiconductor chip disposed within said semiconductor package element.

* * * * *